(12) United States Patent
Oksman et al.

(10) Patent No.: US 9,276,607 B2
(45) Date of Patent: Mar. 1, 2016

(54) PADDING AFTER CHANNEL ENCODING REPETITION AND INTERLEAVING

(71) Applicant: Lantiq Deutschland GmbH, Neubiberg (DE)

(72) Inventors: Vladimir Oksman, Morganville, NJ (US); Joon Bae Kim, Lexington, MA (US); Richard Gross, Acton, MA (US); Peter Heller, Somerville, MA (US)

(73) Assignee: Lantiq Deutschland GmbH, Neubiberg (DE)

( * ) Notice: Subject to any disclaimer, the term of this patent is extended or adjusted under 35 U.S.C. 154(b) by 242 days.

(21) Appl. No.: 13/901,549

(22) Filed: May 23, 2013

(65) Prior Publication Data

US 2013/0254618 A1    Sep. 26, 2013

Related U.S. Application Data

(63) Continuation of application No. PCT/EP2011/005897, filed on Nov. 23, 2011.

(60) Provisional application No. 61/425,224, filed on Dec. 20, 2010, provisional application No. 61/416,733, filed on Nov. 23, 2010.

(51) Int. Cl.
| | |
|---|---|
| *G06F 11/10* | (2006.01) |
| *H03M 13/05* | (2006.01) |
| *H04L 1/00* | (2006.01) |
| *H04L 27/26* | (2006.01) |

(52) U.S. Cl.
CPC ............. *H03M 13/05* (2013.01); *H04L 1/0071* (2013.01); *H04L 1/0083* (2013.01); *H04L 27/2601* (2013.01)

(58) Field of Classification Search
CPC .................................................... G06F 11/1076
USPC ......................................... 714/763, 752, 755
See application file for complete search history.

(56) References Cited

U.S. PATENT DOCUMENTS

| | | | |
|---|---|---|---|
| 6,233,279 B1* | 5/2001 | Boon | 375/240.08 |
| 6,268,973 B1* | 7/2001 | Bickers | 360/48 |
| 6,437,711 B1 | 8/2002 | Nieminen et al. | |
| 7,587,005 B2* | 9/2009 | Tran | 375/341 |
| 8,559,539 B2* | 10/2013 | Kim et al. | 375/265 |
| 8,873,582 B2* | 10/2014 | Noh | H04L 5/0023 370/468 |
| 8,873,652 B2* | 10/2014 | Srinivasa et al. | 375/260 |
| 2003/0188247 A1* | 10/2003 | Ahmed et al. | 714/755 |
| 2007/0143656 A1* | 6/2007 | Niu et al. | 714/752 |

FOREIGN PATENT DOCUMENTS

EP      2073418 A2    6/2009

\* cited by examiner

*Primary Examiner* — Fritz Alphonse

(57) ABSTRACT

Described herein are techniques related to the generation of data blocks that collectively include padding appended before a first or after a last of the data blocks. This Abstract is submitted with the understanding that it will not be used to interpret or limit the scope or meaning of the claims.

12 Claims, 8 Drawing Sheets

PADDING AFTER CHANNEL ENCODING REPETITION AND INTERLEAVING

RELATED APPLICATIONS

This application is a Continuation of PCT Application No. PCT/EP2011/005897, which was filed on Nov. 23, 2011. The PCT application claimed priority benefit of U.S. Provisional Application No. 61/416,733, filed on Nov. 23, 2010 and U.S. Provisional Application No. 61/425,224, filed on Dec. 20, 2010. The entire contents of the foregoing applications are incorporated herein by reference.

BACKGROUND

Digital subscriber line (DSL) technology provides high-speed data transfer between two or more modems or multi-carrier apparatuses across ordinary telephone lines (e.g., twisted pair of copper wires), while still providing for plain old telephone service (POTS). Asynchronous Digital Subscriber Line (ADSL) and Very High Digital Subscriber Line (VDSL) have emerged as popular implementations of DSL systems, where ADSL is defined by American National Standard Institute (ANSI) standard T1.413 and International Telecommunication Union (ITU-T) standards G.992.3, G.992.5, and VDSL is defined by ANSI standard T1.424 and ITU-T standard G.993.1. ADSL, VDSL and other similar DSL systems (collectively referred to as "xDSL") typically provide digital data transfer in a frequency range above the POTS band (e.g., about 300 Hz to 4 kHz), for example ADSL G.992.3 operates at frequencies from about 25 kHz to about 1.1 MHz. Packet-based technology (e.g., ITU G.hn, Home-PNA, HomePlug® AV and Multimedia over Coax Alliance (MoCA)) also provides high-speed data transfer for multicarrier apparatuses. Some multicarrier apparatuses may be enabled to communicate using IEEE 802.11 and IEEE 802.16 (WiMAX) wireless technologies.

One feature of such multicarrier apparatuses that allows them to provide high data rates is their ability to communicate symbols over a multi-carrier channel. Such a multi-carrier channel may include a number of frequencies or "carriers" (e.g., carriers $f_1, f_2, \ldots f_N$) that span a frequency spectrum supported by the telephone line or other communication medium. In effect, by breaking the frequency spectrum into multiple carriers, the multicarrier apparatuses can transmit data over each of the carriers (instead of just a single carrier), thereby allowing them to "stuff" more data through the communication medium (e.g., telephone twisted pair).

During communication, a specific number of bytes per unit time may be transmitted on each carrier based on a signal-to-noise ratio (SNR). Typically, more bytes are transmitted on carriers that have a relatively high SNR, while fewer bytes are transmitted on frequencies that have a relatively low SNR. Although encoding and decoding data conveyed on multiple frequencies makes multicarrier communication computationally complex, it gives the multicarrier apparatuses the ability to provide users with high speed data connections with relatively few errors.

Although a multicarrier channel affords communication systems some ability to account for particularly noisy regions of the frequency spectrum, other components are typically used to account for more dynamic noise sources, such as impulse noise. Therefore, to achieve high data rates with high accuracy, improvements can be made to allow communication systems to communicate more efficiently.

BRIEF DESCRIPTION OF THE DRAWINGS

The Detailed Description references the accompanying figures. In the figures, the left-most digit(s) of a reference number identifies the figure in which the reference number first appears. The same numbers are used throughout the drawings to reference like features and components. Also, note that any text smaller than ten point is presented merely to indict where text would appear in the depicted figures. Since such text is merely an indicator of where text might appear, the content of such text is unimportant to the understanding the implementations depicted.

DETAILED DESCRIPTION

Figure 1:
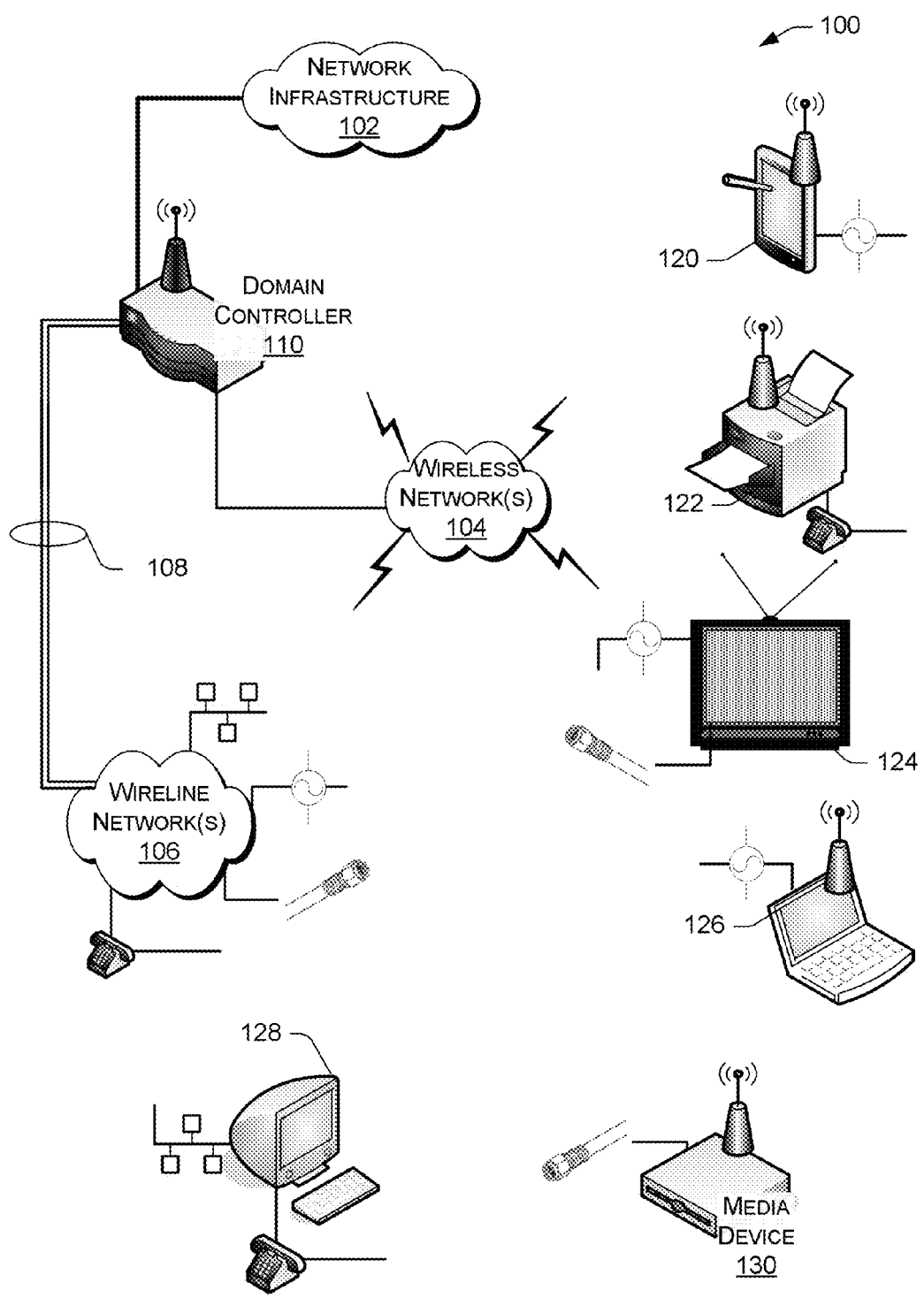
FIG. 1 shows an exemplary networking communications arrangement in which one or more implementations of the techniques described herein may be employed.

Described herein are techniques related to the generation of data blocks that collectively include padding appended before a first or after a last of the data blocks.

The independent claims define the invention in various aspects. The dependent claims define embodiments of the invention.

In a first aspect, the invention encompasses a network device comprising: an interface unit to receive data; an encoder to process the data, the encoder to generate at least a plurality of blocks from the data and add padding to a collective group of blocks from the plurality of blocks. At least one effect of the foregoing device is that a multicarrier apparatus may be implemented with a single interleaver, rather than multiple interleavers. Another effect of the foregoing device is adding padding to a plurality of blocks, rather than individual blocks, improves processing time of the device.

In an embodiment of the device according to the invention in the first aspect the padding is to be added to a last block of the collective group of blocks.

In an embodiment of the device according to the invention in the first aspect the padding is to be added to a first block of the collective group of blocks.

In an embodiment of the device according to the invention in the first aspect the padding comprises zeros.

In an embodiment of the device according to the invention in the first aspect the plurality of blocks and the collective group of blocks are fragment blocks generated by an aggregation and fragmentation unit.

In an embodiment of the device according to the invention in the first aspect the device further includes an interleaver to interleave the collective group of blocks with padding.

In a second aspect the invention encompasses method, which may include a transceiver configured to: receive data;

and process the data to generate at least a plurality of blocks from the data and add padding to a collective group of blocks from the plurality of blocks. At least one effect of the foregoing method is that a multicarrier device implementing the method may be implemented with a single interleaver, rather than multiple interleavers. Another effect of the foregoing method is adding padding to a plurality of blocks, rather than individual blocks, improves processing time of the device.

In an embodiment of the method according to the invention in the second aspect the padding is added to a last block of the collective group of blocks.

In an embodiment of the method according to the invention in the second aspect the padding is added to a first block of the collective group of blocks.

In an embodiment of the method according to the invention in the second aspect the padding comprises zeros.

In an embodiment of the method according to the invention in the second aspect the plurality of blocks and the collective group of blocks are information blocks generated by forward error correction encoder.

In an embodiment of the method according to the invention in the second aspect the plurality of blocks and the collective group of blocks are fragment blocks generated by an aggregation and fragmentation unit.

In an embodiment of the method according to the invention in the second aspect the processing divides the plurality of blocks into at least two collective groups of blocks from the plurality of blocks and adds padding to each of the two collective groups of blocks.

An exemplary communication arrangement may employ at least two multicarrier apparatuses or nodes. The exemplary communication arrangement may also employ a multicarrier controller apparatus or controller node. In one implementation, the multicarrier apparatuses/controller are Orthogonal Frequency Division Multiplexing (OFDM) apparatuses capable of implementing the herein described techniques. In another implementation, the exemplary communication arrangement employs apparatuses or nodes that communicate via a wireless/wireless medium by way of one or more communication protocols.

The multicarrier apparatuses may communicate through a communication channel. The communication channel may be realized as one or more wireless communication media, one or more wireline communication media (e.g., coaxial cable, twisted pair of copper wires, power line wiring, Ethernet cabling, optical fiber, etc.), or combinations thereof. Accordingly, the multicarrier apparatuses may include structure and functionality that enable signal communication over such media. Such structure and functionality may include one or more antennas, integrated wireline interfaces, and the like. Such structure and functionality may employ multiple differing wireline media (e.g., coaxial cable and power line wiring). Depending on the implementation, the multicarrier apparatuses may communicate with one another directly (peer-to-peer mode) or the multicarrier apparatuses may communicate via the controller apparatus. The G.hn recommendations specify standards by which multicarrier apparatuses may communicate via such communications channels.

FIG. 1 shows an exemplary networking communications arrangement 100 in which one or more implementations may be employed. The multicarrier controller apparatus of the arrangement 100 is an access point 110 of a home networking environment. As shown in FIG. 1, the access point 110 may be a residential gateway that distributes broadband services from a connected network infrastructure 102 (e.g., the Internet) to various multicarrier apparatuses via one or more wireless networks 104 and one or more wireline networks 106. The wireless networks 104 may also be called wireless local area networks (WLAN) and the wireline networks 106 may be called local area networks (LANs).

The various multicarrier apparatuses depicted in FIG. 1 include a tablet computer 120, a network printer 122, a television 124, a laptop computer 126, a desktop computer 128, and a media device 130 (e.g., a digital video recorder (DVR) and Internet TV device). The multicarrier apparatuses may be associated with digital content destinations in the home, but may also be associated with digital content sources, such as digital video recorders (DVR), computers providing streaming video, televisions, entertainment centers, and the like.

As depicted, the tablet computer 120 is configured to communicate via both wireless and a power-line wireline networks, the network printer 122 is configured to communicate via both wireless and twisted-pair cabling (e.g., telephone wiring) based wireline networks, the television 124 is configured to communicate via both two different wireline networks (e.g., coaxial cabling and power-line cabling based), the laptop computer 126 communicates via power-line based wireline and wireless networks, and the desktop computer 128 is configured to communicate via an Ethernet cabling based wireline network and twisted-pair cabling (e.g., telephone wiring) based wireline networks. Similarly, the media device 130 is configured to communicate via both wireless and coaxial cabling (e.g., cable TV wiring) based wireline networks. As depicted, the wireline networks 106 include wireline networks based upon Ethernet cabling (e.g., Cat-5), power-line wiring, coaxial cabling, and telephone cabling. As represented by multiple wire connection 108, the domain controller 110 is connected via multiple different wirings to the multiple different wireline networks 106.

Furthermore, the multicarrier apparatuses may be enabled to communicate using packet-based technology (e.g., ITU G.hn, HomePNA, HomePlug® AV and Multimedia over Coax Alliance (MoCA)) and xDSL technology). Such xDSL technology may include Asymmetric Digital Subscriber Line (ADSL), ADSL2, ADSL2+, Very high speed DSL (VDSL), VDSL2, G.Lite, and High bit-rate Digital Subscriber Line (HDSL). In addition, some multicarrier apparatuses (such as 120, 122, 126, and 130) may be enabled to communicate using IEEE 802.11 and IEEE 802.16 (WiMAX) wireless technologies.

Signals exchanged between the multicarrier apparatuses may include multicarrier symbols that each includes a plurality of tones or sub-channels. Each of the tones within a multicarrier symbol may have data bits modulated thereon that are intended for delivery from one of the multicarrier apparatuses to another.

Figure 2:
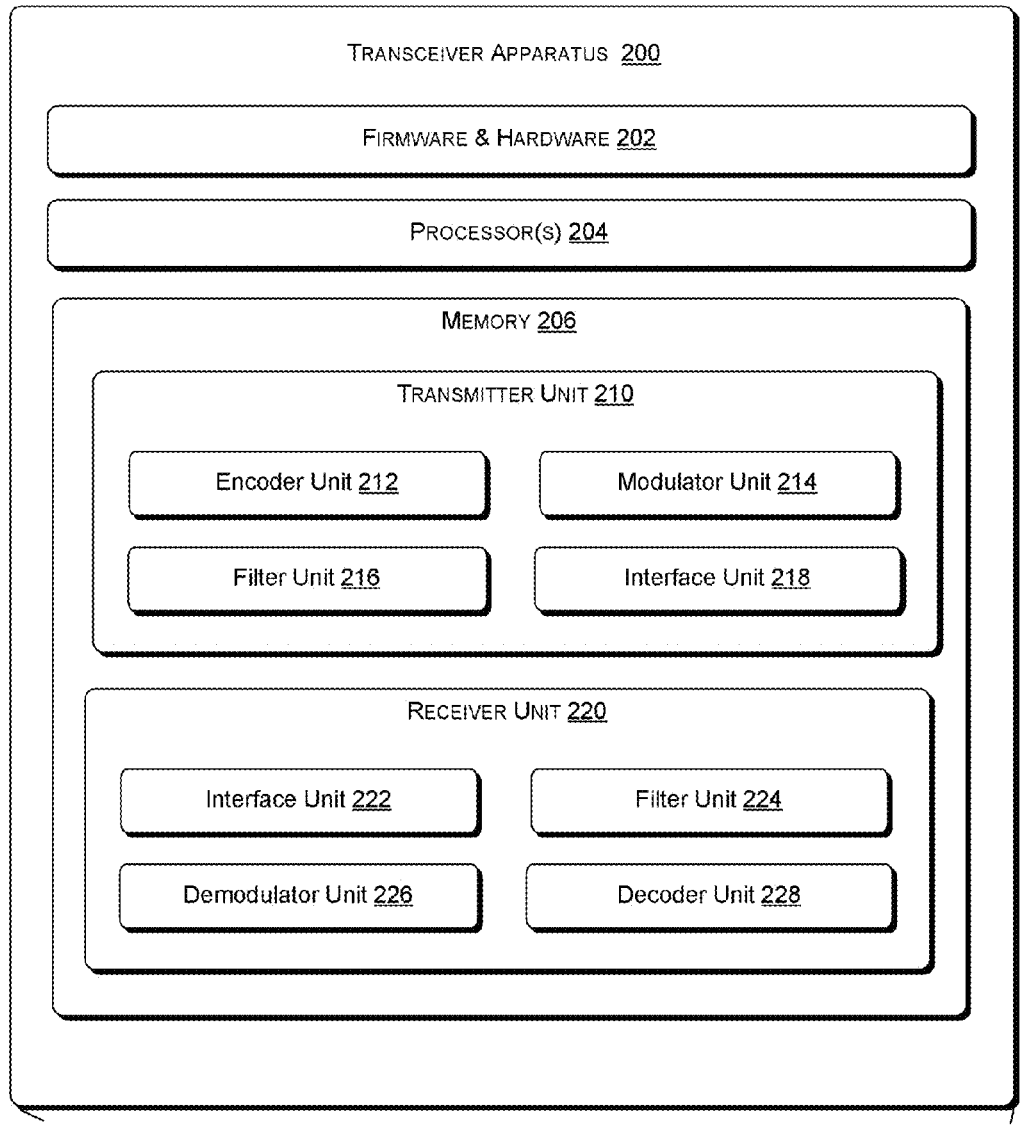
FIG. 2 illustrates an exemplary transmitter apparatus configured to implement the techniques described herein.

FIG. 2 shows an exemplary multicarrier apparatus configured to implement the techniques described herein. As depicted, the exemplary multicarrier apparatus is the media device 130 introduced in FIG. 1. Alternatively, other multicarrier apparatus introduced in FIG. 1 may be been depicted here. Furthermore, the multicarrier controller apparatus (which is the access point 110 in FIG. 1) may be been depicted here as well.

The media device 130 shown in FIG. 2 is an example of a transceiver apparatus 200 that may be used as a transmitting and receiving apparatus in a multicarrier arrangement, like arrangement 100 shown in FIG. 1. The transceiver apparatus 200 may include firmware & hardware 202, one or more processors 204, and a memory 206. The transceiver apparatus 200 has one or more modules of processor-executable instructions stored in the memory 206. The transceiver apparatus 200 may include a module called a transmitter unit 210. The transmitter unit 210 may include several sub-modules, such as an encoder unit 212, a modulator unit 214, a filter unit 216, and an interface unit 218.

The encoder unit 212 may be capable of receiving data that is for communication to a receiving device coupled to the transceiver apparatus via a wireless or wireline medium. More specifically, the encoder unit 212 may be capable of translating incoming data bit streams into in-phase and quadrature components for each of the plurality of tones. The encoder unit 212 may be arranged to output a number of symbol sequences that are equal to the number of tones available to the system.

The modulator unit 214 may be capable of receiving symbol sequences to produce a modulated signal in the form of a discrete multi-tone signal. The modulator unit 214 may pass the modulated signal to the filter unit 216 to undergo various filtering. Then the filtered signal may be passed to the interface unit 218 for communication over the medium to a receiving device.

The transceiver apparatus may also include a receiver unit 220 that is capable of receiving modulated multi-tone signals communicated over the medium from a transmitting device. The receiver unit 220 may include an interface unit 222, a filter unit 224, a demodulator unit 226, and a decoder unit 228.

Signals received by the receiver unit 220 may be passed to the filter unit 224 via the interface unit 222. After received signals undergo filtering by way of the filter unit 224, the filtered signals may be demodulated by the demodulator unit 226. The demodulated signals may be passed to and processed by the decoder unit 228. The decoder unit 228 produces data bit streams for consumption by a computing device, or the like. Effectively, the demodulator unit 226 and the decoder unit 228 perform the opposite functions of the modulator unit 214 and the encoder unit 212, respectively.

While the transceiver apparatus 200 is described herein in terms of modules and sub-modules of processor-executable instructions, the functionalities of these modules and sub-modules may be implemented in software, hardware, firmware, or some combination thereof.

For example, the transceiver apparatus 200 may have a hardware component called a controller. The terms "controller" and "processor" include all types of digital processing devices including, without limitation, digital signal processors (DSPs), reduced instruction set computers (RISC), general-purpose (CISC) processors, microprocessors, gate arrays (e.g., FPGAs), PLDs, reconfigurable compute fabrics (RCFs), array processors, secure microprocessors, and application-specific integrated circuits (ASICs). Such digital processors may be contained on a single unitary IC die, or distributed across multiple components.

Of course, each of the transmitter unit 210 and the receiver unit 220 may have one or more of its own dedicated controllers or processors. Alternatively, each unit may share one or more common controllers or processors.

Figure 3:
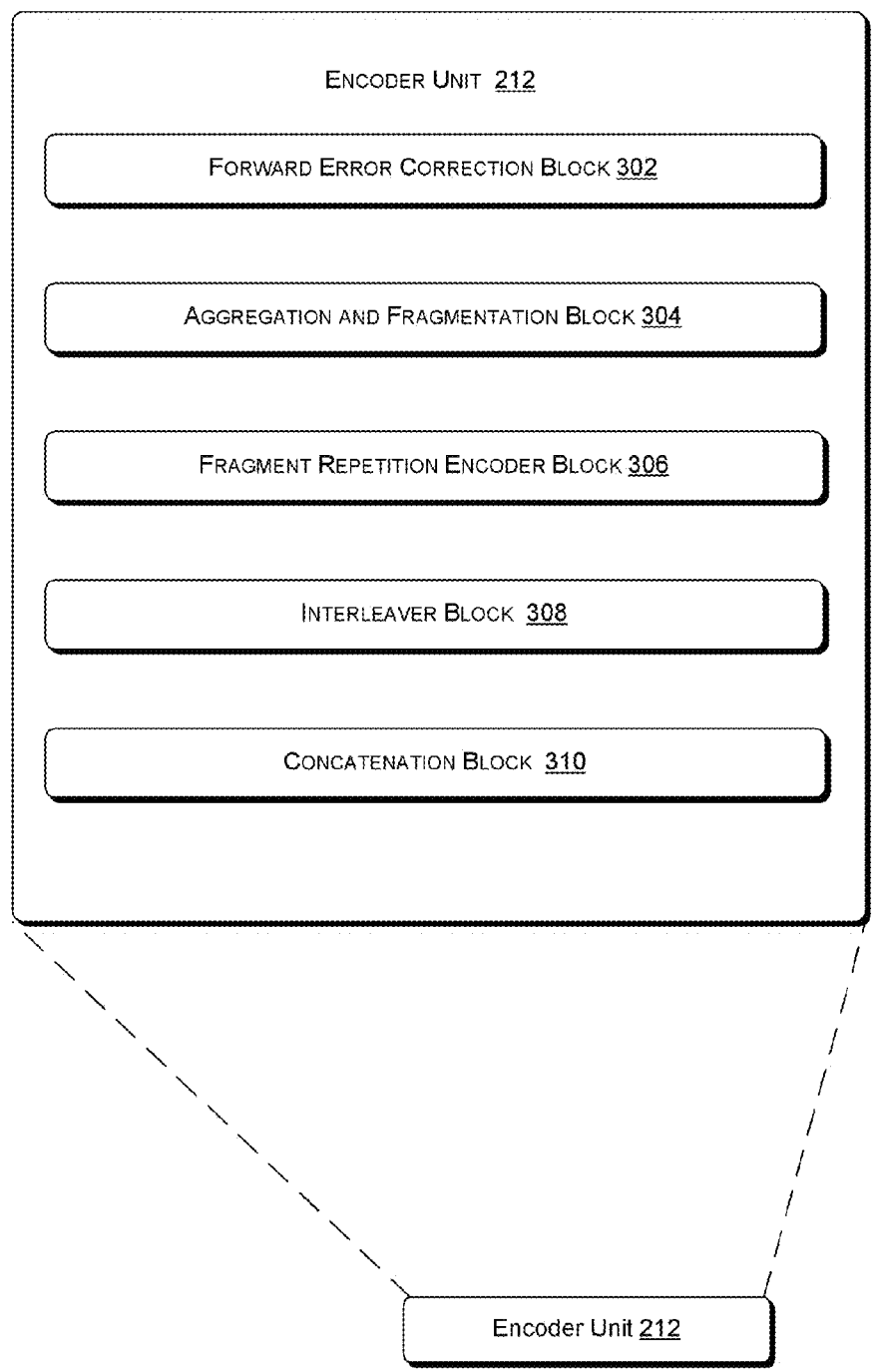
FIG. 3 shows an exemplary implementation of the encoder unit, which is configured to employ the techniques described herein.

FIG. 3 shows an exemplary implementation of the encoder unit 212, which is configured to employ the techniques described herein.

Referring now to FIG. 3, to transmit data, the encoder unit 212 receives payload data and passes it to a forward error correction (FEC) encoder 302, where the FEC encoder may append redundancy bytes to the payload data to form a codeword. The formation of the codeword may also be handled by an aggregation and fragmentation block 304. A fragment repetition encoder block 306 may be included to support robust communication mode (RCM), but the block 306 may be disabled in the case of normal mode of operation. An interleaver block 308 may be implemented and is to interleave successive codewords with one another to form an interleaved data stream. The interleaved successive codewords may be concatenated by a concatenation block 31.

More particularly, incoming payload data may be divided into sequential information blocks $N_{FEC}$ of K bytes per block. Each information block $N_{FEC}$ may be encoded by the FEC encoder block 302. The aggregation and fragmentation block 304 may collect one or more FEC codewords and forms an FEC codeword block. The number of FEC codewords in a FEC codeword block may be from 1 to a predetermined value. The FEC codewords may be concatenated into an FEC codeword block in the order they are output by the FEC encoder block 302, and with the same order of bits. The formation of the FEC codeword block may be implemented by the aggregation and fragmentation block 304.

The FEC codeword block may be partitioned into fragments of the same size, $B_0$ bits each. The number of fragments is $N_{frg}=\mathrm{ceil}(s \times N_{FEC}/B_0)$, where s is the number of FEC codewords in an FEC codeword block. To obtain integer number of fragments, the FEC codeword block may be padded with up to $N_{frg}-1$ zeros.

When used, the fragment repetition encoder block 306 provides repetitions of fragments with a repetition rate of R. If R>1 is set, each fragment may be copied R−1 times and all copies concatenated into a fragment buffer, implemented by the fragment repetition encoder block 306, for example, so that the first bit of each copy follows the last bit of previous copy. The total size of the fragment buffer may be $B_0 \times R$ bits.

All fragments of the fragment buffer may be interleaved by the interleaver block 308. If the number of bits in the fragment does not fit the integer number of symbols, the fragment may be padded accordingly prior to the interleaving by the interleaver block 308. The pad may be generated by repeating the bits of the fragment starting from the first bit of the fragment, in ascending order, until the symbol is filled up. If the value of $B_0$ is selected to be less than $N_{ZC}$, where $N_{ZC}$ represents bits loaded in the symbols that span at least 10 ms for the case of 50 Hz AC lines, and at least 8.33 ms for the case of 60 Hz AC lines or lines with no AC, the interleaver block 308 may be set into Interleaving-over-AC-cycle (IoAC) mode or in Interleaving-over-Fragment (IoF) mode. If set to IoAC mode, each fragment $B_0$ may be padded to the closest integer number of $N_{ZC}$. The pad may be generated by cyclical repeating of the bits, starting from its first bit. The first bit of the pad may follow the last bit of the fragment buffer and may be the repetition of the first bit of the same fragment buffer. After fragment buffer is padded, it may be passed for concatenation. If set to IoF mode, the fragment buffer may be passed for concatenation with no additional bits padded. The fragment buffers may be concatenated into an encoded payload block, in the order of the sourcing fragments.

While the encoder unit 212 is described herein in terms of modules and sub-modules of processor-executable instructions, the functionalities of these modules and sub-modules may be implemented in software, hardware, firmware, or a combination thereof.

Figure 4:
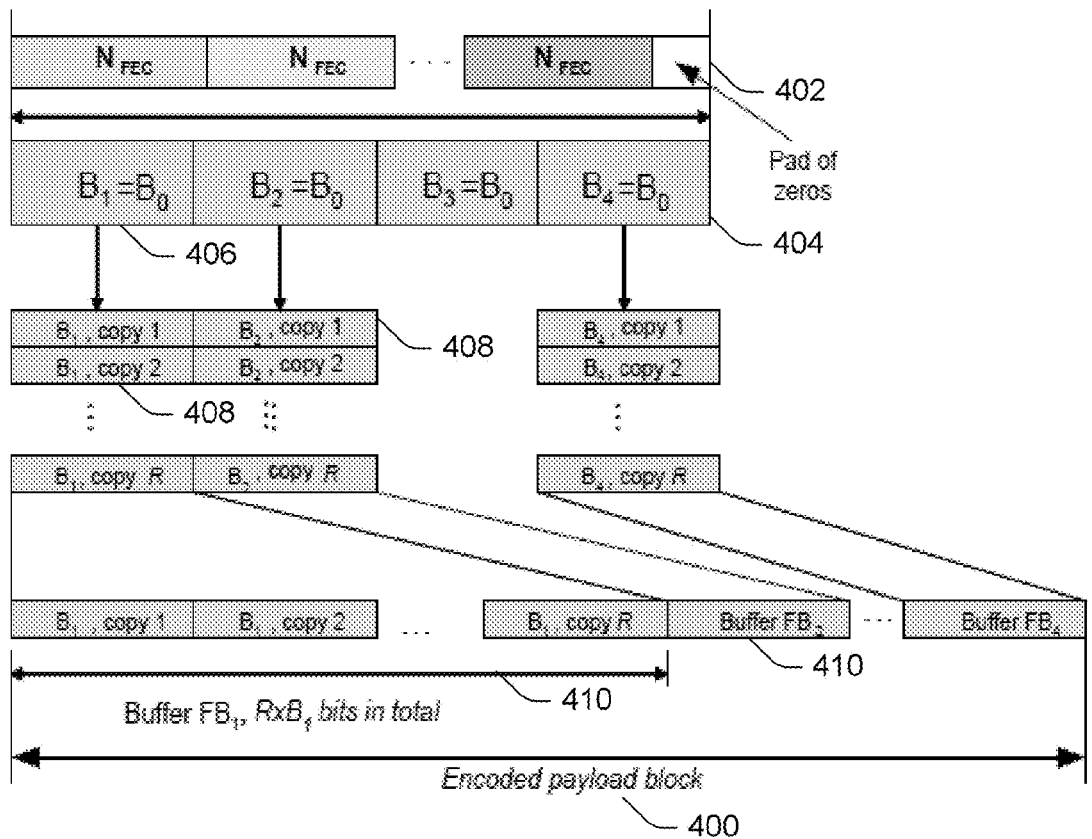
FIG. 4 shows an exemplary implementation of an encoded payload block that may be generated by the encoder unit illustrated in FIG. 3.

FIG. 4 shows an exemplary implementation of an encoded payload block 400 that may be generated by the encoder unit 212. As is illustrated, the encoded payload block 400 may include, before final encoding, sequential information blocks $N_{FEC}$ 402. Zeros may be added to the end of each information block $N_{FEC}$ 402. The sequential information blocks $N_{FEC}$ 402 may be processed by the aggregation and fragmentation block 304 to generate an FEC codeword block 404. As discussed, the FEC codeword block 404 may be partitioned into fragments 406 of the same size, $B_0$ bits each, where each fragment 406 may include added zeros. The fragment repetition encoder block 306 may be used to add redundancy to each fragment 406. As is illustrated, one or more redundant fragment 408 may be generated by the fragment repetition encoder block 306 and concatenated together to provide one or more fragment buffers 410.

Figure 5:
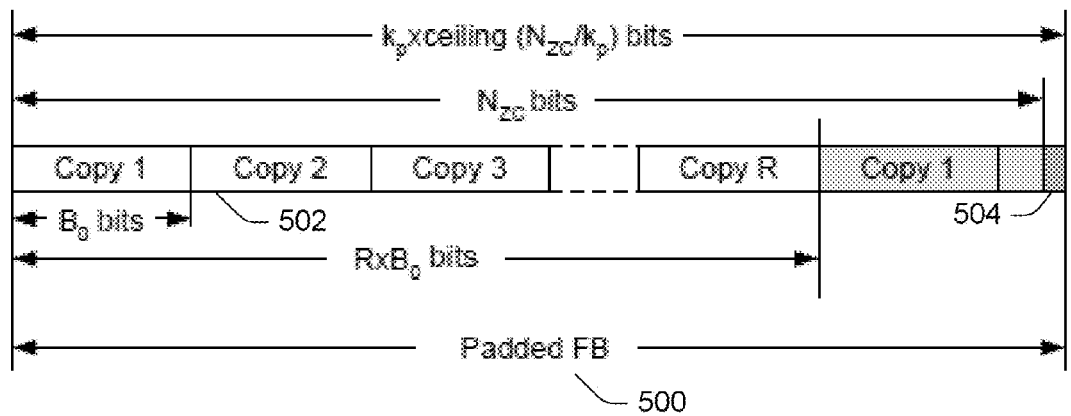
FIG. 5 shows an exemplary implementation of a fragment block that may be generated by the encoder unit illustrated in FIG. 3.

FIG. 5 shows an exemplary implementation of a fragment block 500 that may be generated by the encoder unit 212. Note, for simplicity, only the fragment block 500 and the contents thereof are shown. However, it is to be understood that the fragment block 500 may be incorporated into a final encoded payload block that includes one or more interleaved fragment blocks. Unlike the implementation illustrated in FIG. 4, the fragment block 500 includes fragments 502, where each fragment 502 does not have padding or zeros added thereto. Each fragment 502 may be a unique fragment of bits, or redundant copies of one or more fragments of bits. Moreover, each fragment 502 may be an information block $N_{FEC}$ or fragments of an FEC codeword block, as is shown.

In the exemplary implementation illustrated in FIG. 5, rather than appending zeros or other padding values to each fragment 502, zeros or other padding 504 are added to the end of the fragment block 500, such that the fragment block 500 corresponds to an integer number of symbols and the maximum number of bits that may be accommodated by the one or more symbols. It is also possible and contemplated that the fragment block 500 may be split into two or more fragment sub-blocks. Each fragment sub-block may include a one or more fragments with padding added at the end of each fragment sub-block.

FIG. 5 illustrates padding 504 added at the end of the fragment block 500, but it is also contemplated that such padding 504 may be added to the front of the fragment block 500.

Figure 6:
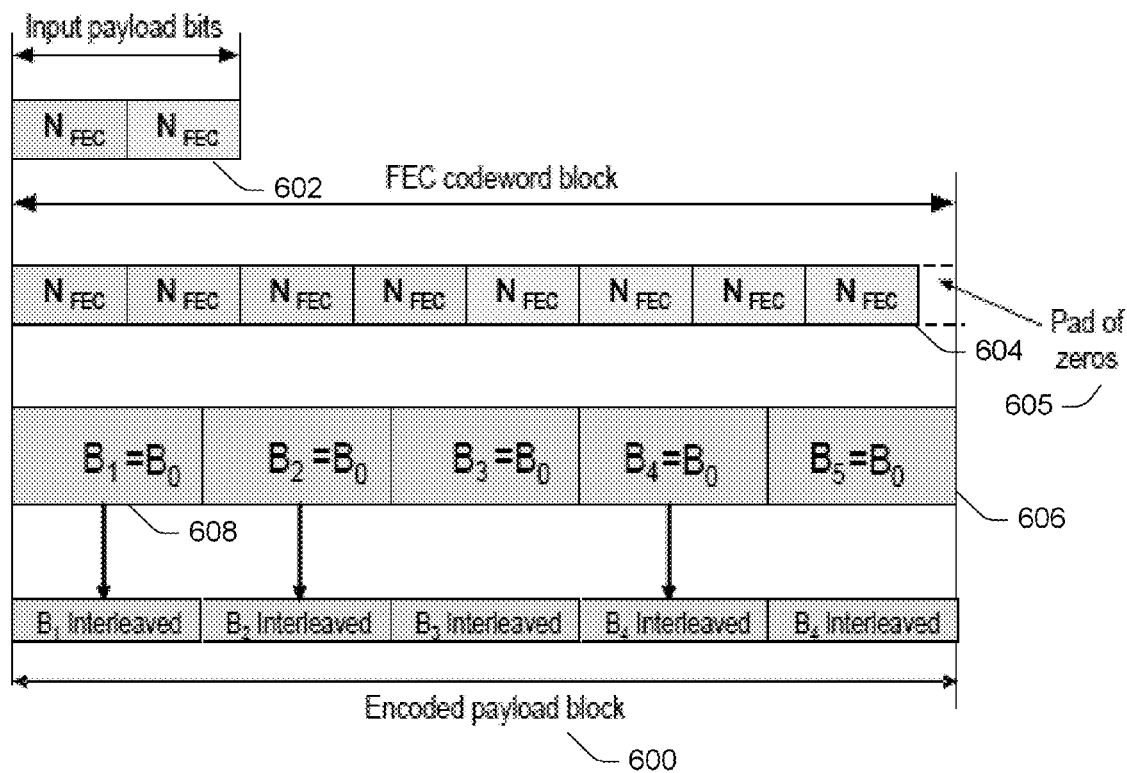
FIG. 6 shows an exemplary implementation of another encoded payload block that may be generated by the encoder unit illustrated in FIG. 3.

FIG. 6 shows an exemplary implementation of another encoded payload block 600 that may be generated by the encoder unit 212. As is illustrated, the encoded payload block 600 may include, before final encoding, sequential information blocks $N_{FEC}$ 602. In this example, the sequential information blocks $N_{FEC}$ 602 may be repeated to provide sequential information blocks $N_{FEC}$ 604 that includes a number of repeated information blocks $N_{FEC}$ 602. In this example, zeros or other padding 605 may be added to the end of the sequential information blocks $N_{FEC}$ 604. The sequential information blocks $N_{FEC}$ 604 with padding 605 may be processed by the aggregation and fragmentation block 304 to generate an FEC codeword block 606. As discussed, FEC codeword block 606 may be partitioned into fragments 608 of the same size, $B_0$ bits each. The fragment repetition encoder block 306 may be used to add redundancy to each fragment 608.

In another embodiment to that shown in FIG. 6, tail bits (e.g., from Reed-Solomon error correction scheme) may be added to the end of sequential information blocks $N_{FEC}$ 604. Zeros or other padding may be added to the end of the sequential information blocks $N_{FEC}$ 604 that include such tail bits.

Figure 7:
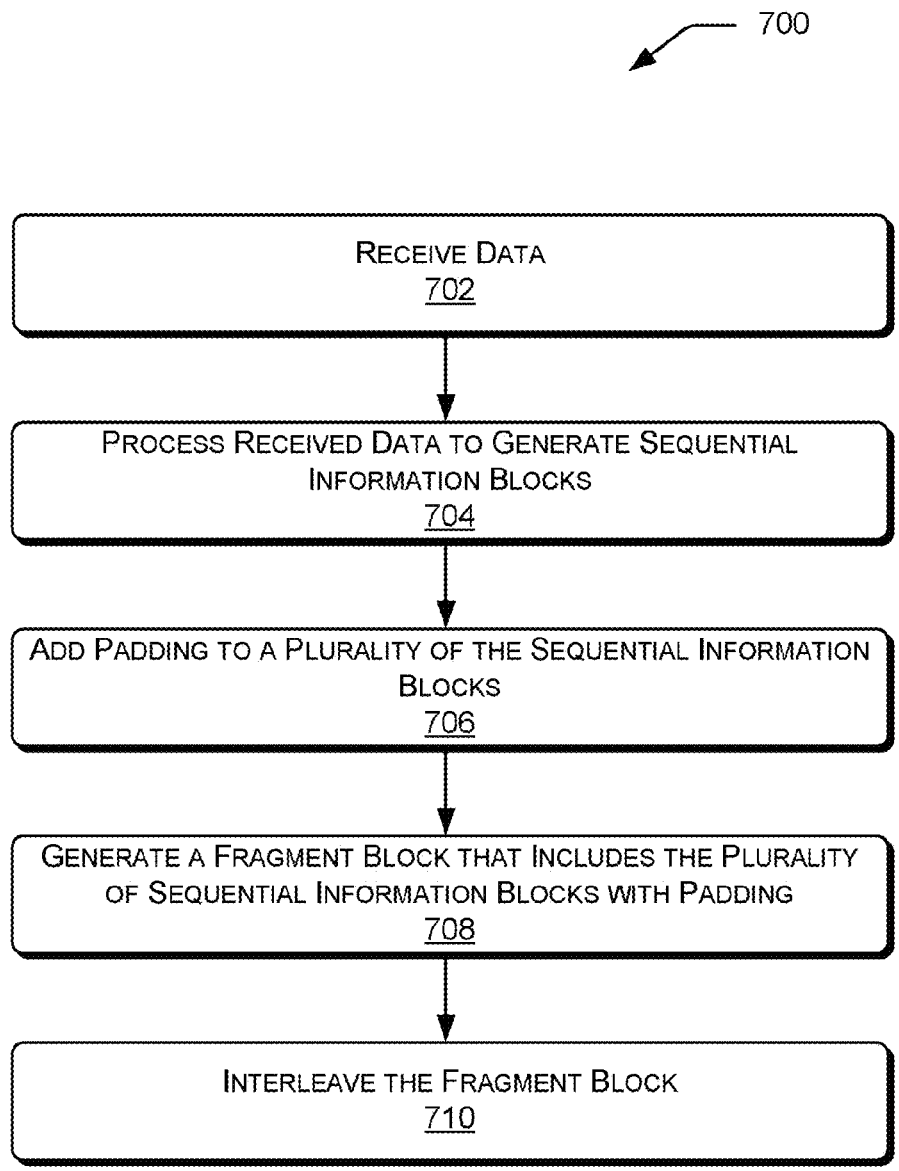
FIG. 7 is a flowchart illustrating exemplary process that may implement the techniques described herein for generating encoded payload.

FIG. 7 is a flowchart illustrating exemplary process 700 that may implement the techniques described herein for generating encoded payload. The exemplary process may be performed, at least in part, by a networking device such as a multicarrier controller apparatus (e.g., the access point 110 of FIG. 1) and/or a multicarrier apparatus (e.g., the media device 130 of FIGS. 1 and 2). Many of the operations of the process 700 are described with references to the illustration of such operations in previously introduced drawing figures.

At 702, the process 400 begins with a multicarrier device receiving data that is to be encoded for transmission on a medium, such as a wireline or wireless communication channel. In one implementation, the received data is in the format of one or more data transmission units (DTU).

At 704, the received data is processed to generate a plurality of sequential information blocks. In one implementation, the information blocks are generated by the FEC encoder 302.

At 706, padding is added to the plurality of sequential information blocks. The padding may be zeros or other values added to the end of the plurality of sequential information blocks. The padding may also be added before the sequential information blocks. Alternatively, the padding may be disposed between consecutive ones of the information blocks.

At 708, a fragment block is generated from the plurality of sequential information blocks with padding. In one implementation, the fragment blocks are generated by the aggregation and fragmentation block 304.

At 710, the fragment block is interleaved. The interleaving may be done by the interleaver block 308.

Figure 8:
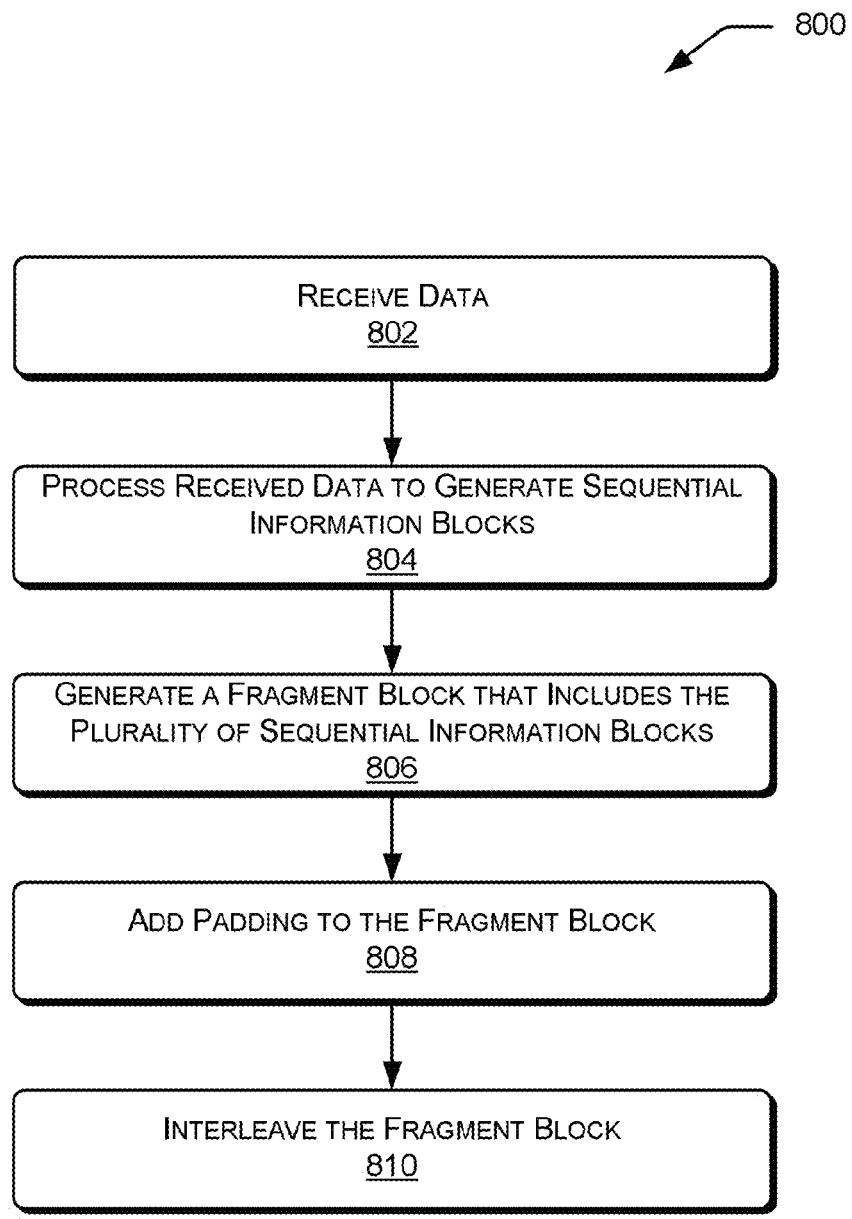
FIG. 8 is a flowchart illustrating exemplary process that may implement the techniques described herein for generating encoded payload.

FIG. 8 is a flowchart illustrating exemplary process 800 that may implement the techniques described herein for generating encoded payload. The exemplary process may be performed, at least in part, by a networking device such as a multicarrier controller apparatus (e.g., the access point 110 of FIG. 1) and/or a multicarrier apparatus (e.g., the media device 130 of FIGS. 1 and 2). Many of the operations of the process 800 are described with references to the illustration of such operations in previously introduced drawing figures.

At 802, the process 400 begins with a multicarrier device receiving data that is to be encoded for transmission on a medium, such as a wireline or wireless communication channel. In one implementation, the received data is in the format of one or more data transmission units (DTU).

At 804, the received data is processed to generate a plurality of sequential information blocks. In one implementation, the information blocks are generated by the FEC encoder 302.

At 806, a fragment block is generated from the plurality of sequential information blocks. In one implementation, the fragment blocks are generated by the aggregation and fragmentation block 304.

At 808, padding is added to the fragment block. The padding may be zeros or other values added to the end of the fragment block. The padding may also be added before the fragment block. Alternatively, the fragment block may be divided and padding may be added between sub-fragment blocks.

At 810, the fragment block is interleaved. The interleaving may be done by the interleaver block 308.

Exemplary implementations discussed herein may have various components collocated; however, it is to be appreciated that the various components of the arrangement may be located at distant portions of a distributed network, such as a communications network and/or the Internet, or within a dedicated secure, unsecured and/or encrypted arrangement. Thus, it should be appreciated that the components of the arrangements may be combined into one or more apparatuses, such as a modem, or collocated on a particular node of a distributed network, such as a telecommunications network. Moreover, it should be understood that the components of the described arrangements may be arranged at any location within a distributed network without affecting the operation of the arrangements. For example, the various components can be located in a Central Office modem (CO, ATU-C, VTU-O), a Customer Premises modem (CPE, ATU-R, VTU-R), an xDSL management device, or some combination thereof. Similarly, one or more functional portions of the arrangement may be distributed between a modem and an associated computing device.

The above-described arrangements, apparatuses and methods may be implemented in firmware, hardware, software, one or more software modules, one or more software and/or hardware testing modules, one or more telecommunications test devices, one or more DSL modems, one or more ADSL modems, one or more xDSL modems, one or more VDSL modems, one or more linecards, one or more G.hn transceivers, one or more MOCA transceivers, one or more Homeplug transceivers, one or more powerline modems, one or more wired or wireless modems, test equipment, one or more multicarrier transceivers, one or more wired and/or wireless wide/local area network systems, one or more satellite communication systems, network-based communication systems (such as an IP, Ethernet or ATM system), one or more modems equipped with diagnostic capabilities, or the like, or on one or more separate programmed general purpose computers having a communications device or in conjunction with any of the following communications protocols: CDSL, ADSL2, ADSL2+, VDSL1, VDSL2, HDSL, DSL Lite, IDSL, RADSL, SDSL, UDSL, MOCA, G.hn, Homeplug or the like.

Additionally, the arrangements, procedures and protocols of the described implementations may be implemented on a special purpose computer, a programmed microprocessor or microcontroller and peripheral integrated circuit element(s), an ASIC or other integrated circuit, a digital signal processor, a flashable device, a hard-wired electronic or logic circuit such as discrete element circuit, a programmable logic device such as PLD, PLA, FPGA, PAL, a modem, a transmitter/receiver, any comparable device, or the like. In general, any apparatus capable of implementing a state machine that is in turn capable of implementing the methodology described and illustrated herein may be used to implement the various communication methods, protocols and techniques according to the implementations.

Furthermore, the disclosed procedures may be readily implemented in software using object or object-oriented software development environments that provide portable source code that can be used on a variety of computer or workstation platforms. Alternatively, the disclosed arrangements may be implemented partially or fully in hardware using standard logic circuits or VLSI design. The communication arrangements, procedures and protocols described and illustrated herein may be readily implemented in hardware and/or software using any known or later developed systems or structures, devices and/or software by those of ordinary skill in the applicable art from the functional description provided herein and with a general basic knowledge of the computer and telecommunications arts.

Moreover, the disclosed procedures may be readily implemented in software that can be stored on a computer-readable storage medium, executed on a programmed general-purpose computer with the cooperation of a controller and memory, a special purpose computer, a microprocessor, or the like. In these instances, the arrangements and procedures of the described implementations may be implemented as a program embedded on a personal computer such as an applet, JAVA® or CGI script, as a resource residing on a server or computer workstation, as a routine embedded in a dedicated communication arrangement or arrangement component, or the like. The arrangements may also be implemented by physically incorporating the arrangements and/or procedures into a software and/or hardware system, such as the hardware and software systems of a test/modeling device.

The implementations herein are described in terms of exemplary embodiments. However, it should be appreciated that individual aspects of the implantations may be separately claimed and one or more of the features of the various embodiments may be combined. In the above description of exemplary implementations, for purposes of explanation, specific numbers, materials configurations, and other details are set forth in order to better explain the invention, as claimed. However, it will be apparent to one skilled in the art that the claimed invention may be practiced using different details than the exemplary ones described herein. In other instances, well-known features are omitted or simplified to clarify the description of the exemplary implementations.

The inventors intend the described exemplary implementations to be primarily examples. The inventors do not intend these exemplary implementations to limit the scope of the appended claims. Rather, the inventors have contemplated that the claimed invention might also be embodied and implemented in other ways, in conjunction with other present or future technologies.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts and techniques in a concrete fashion. The term "techniques," for instance, may refer to one or more devices, apparatuses, systems, methods, articles of manufacture, and/or computer-readable instructions as indicated by the context described herein.

As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more," unless specified otherwise or clear from context to be directed to a singular form.

The exemplary processes discussed herein are illustrated as a collection of blocks in a logical flow graph, which represents a sequence of operations that can be implemented with hardware, software, firmware, or some combination thereof. In the context of software/firmware, the blocks represent instructions stored on one or more processor-readable storage media that, when executed by one or more processors, perform the recited operations. The operations of the exemplary processes may be rendered in virtually any programming language or environment including (by way of example and not limitation): C/C++, Fortran, COBOL, PASCAL, assembly language, markup languages (e.g., HTML, SGML, XML, VoXML), and the like, as well as object-oriented environments such as the Common Object Request Broker Architecture (CORBA), Java™ (including J2ME, Java Beans, etc.), Binary Runtime Environment (BREW), and the like.

Note that the order in which the processes are described is not intended to be construed as a limitation, and any number of the described process blocks can be combined in any order to implement the processes or an alternate process. Additionally, individual blocks may be deleted from the processes without departing from the spirit and scope of the subject matter described herein.

The term "processor-readable media" includes processor-storage media. For example, processor-storage media may include, but are not limited to, magnetic storage devices (e.g., hard disk, floppy disk, and magnetic strips), optical disks (e.g., compact disk (CD) and digital versatile disk (DVD)), smart cards, flash memory devices (e.g., thumb drive, stick, key drive, and SD cards), and volatile and non-volatile memory (e.g., random access memory (RAM), read-only memory (ROM)).

For the purposes of this disclosure and the claims that follow, the terms "coupled" and "connected" may have been used to describe how various elements interface. Such described interfacing of various elements may be either direct or indirect.

What is claimed is:

1. A network device comprising:
an interface unit to receive data;
an encoder to process the data, the encoder to generate at least a plurality of blocks from the data and add padding to a collective group of blocks from the plurality of blocks.

2. The network device as recited in claim 1, wherein the padding is to be added to a last block of the collective group of blocks.

3. The network device as recited in claim 1, wherein the padding is to be added to a first block of the collective group of blocks.

4. The network device as recited in claim 1, wherein the padding comprises zeros.

5. The network device as recited in claim 1, wherein the plurality of blocks and the collective group of blocks are information blocks generated by forward error correction encoder.

6. The network device as recited in claim 1, wherein the plurality of blocks and the collective group of blocks are fragment blocks generated by an aggregation and fragmentation unit.

7. The network device as recited in claim 1, further comprising an interleaver to interleave the collective group of blocks with padding.

8. A device, comprising:
an interface; and
an encoder device coupled to the interface, the encoder device to receive data from the interface and process the received data to provide a plurality of blocks that have padding added to a last or first block of the plurality of blocks.

9. The device according to claim 8, wherein the plurality of blocks is a subset of a collective group of blocks provided by the interface.

10. The device according to claim 8, wherein the plurality of blocks is a subset of a collective group of blocks generated by a forward correction encoder device, the collective group of blocks being information blocks.

11. The device according to claim 8, wherein the plurality of blocks is a subset of a collective group of blocks generated by an aggregation and fragmentation device, the collective group of blocks being fragment blocks.

12. The device according to claim 8, further comprising an interleaver to interleave the plurality of blocks that have padding added to the last or first block of the plurality of blocks.

* * * * *